US009368957B2

(12) United States Patent
Prisse et al.

(10) Patent No.: US 9,368,957 B2
(45) Date of Patent: Jun. 14, 2016

(54) PROTECTION METHOD AND DEVICE OF AN ELECTRICAL NETWORK FOR AIRCRAFT

(71) Applicant: Airbus Operations (SAS), Toulouse (FR)

(72) Inventors: Lucien Prisse, Toulouse (FR); Ludovic Lam Shang Leen, Blan (FR); Vincent Pauvert, Nailloux (FR); Dominique Alejo, Saint-Gauzens (FR)

(73) Assignee: Airbus Operations (SAS), Toulouse (FR)

( * ) Notice: Subject to any disclaimer, the term of this patent is extended or adjusted under 35 U.S.C. 154(b) by 428 days.

(21) Appl. No.: 14/052,255

(22) Filed: Oct. 11, 2013

(65) Prior Publication Data

US 2014/0104734 A1   Apr. 17, 2014

(30) Foreign Application Priority Data

Oct. 11, 2012 (FR) ..................... 12 59693

(51) Int. Cl.
*H02H 3/00* (2006.01)
*H02H 3/38* (2006.01)
*H02H 3/14* (2006.01)
*H02H 3/16* (2006.01)
*G01R 31/02* (2006.01)
*G01R 31/00* (2006.01)

(52) U.S. Cl.
CPC . *H02H 3/38* (2013.01); *H02H 3/14* (2013.01); *H02H 3/16* (2013.01); *G01R 31/008* (2013.01); *G01R 31/025* (2013.01)

(58) Field of Classification Search
CPC ....................................................... H02H 3/38
USPC .............................................................. 361/79
See application file for complete search history.

(56) References Cited

U.S. PATENT DOCUMENTS

| 4,375,660 | A | * | 3/1983 | Tate | ......................... | G01R 1/36 361/42 |
| 5,361,183 | A | * | 11/1994 | Wiese | .................... | B64D 15/12 361/42 |
| 7,362,551 | B2 | * | 4/2008 | Bax | ......................... | H01H 83/14 361/42 |
| 8,941,259 | B2 | * | 1/2015 | Baumann | .................. | H02J 3/36 307/10.1 |
| 2010/0308841 | A1 | | 12/2010 | Karrer et al. | | |

FOREIGN PATENT DOCUMENTS

| EP | 0057498 | 8/1982 |
| EP | 1265076 | 12/2002 |
| WO | 2009043772 | 4/2009 |

OTHER PUBLICATIONS

French Search Report, Jul. 16, 2013.

* cited by examiner

*Primary Examiner* — Stephen W Jackson
(74) *Attorney, Agent, or Firm* — Greer, Burns & Crain Ltd.

(57) ABSTRACT

A method for protecting a bipolar power distribution network supplied with power by an electric power source isolated from an electrical ground of an aircraft. The network includes a resistive protection device configured to be connected to the electrical ground and to the two phases of the network. The method includes the steps of receiving at least one voltage value on at least one of the two phases and/or at least one current value in the electrical ground, comparing the at least one voltage value with a first predetermined threshold value and/or the at least one current value with a second predetermined threshold value and controlling the protection device by changing its resistivity according to the comparison.

20 Claims, 6 Drawing Sheets

PROTECTION METHOD AND DEVICE OF AN ELECTRICAL NETWORK FOR AIRCRAFT

CROSS-REFERENCES TO RELATED APPLICATIONS

This application claims the benefit of the French patent application No. 1259693 filed on Oct. 11, 2012, the entire disclosures of which are incorporated herein by way of reference.

BACKGROUND OF THE INVENTION

The present invention relates to the methods of protecting electrical networks for aircraft, in particular for a bipolar power distribution network, in the case where a power source supplying power to this bipolar network is isolated, in other words with said source not being connected to an electrical ground of the aircraft.

The present invention also relates to devices for protecting electrical networks for aircraft, in particular for a bipolar power distribution network, in the case where a power source supplying power to this bipolar network is isolated, in other words, with this source not being connected to an electrical ground of the aircraft, and to aircraft comprising such protection devices.

It is known that aircraft comprise a general electric network, which connects at least one electric power source to electrical loads formed by on-board systems. For that purpose, the general network is provided with a power supply network connected to the power sources, and with a power distribution network connected to the loads.

It is also known that aircraft comprise numerous on-board systems, which consume electric power, at an ever-increasing rate.

To generate electric power, aircraft conventionally comprise alternative current electrical rotating machines configured to generate electric power (and therefore operating in a generator mode) with a high voltage alternating current (HVAC) and/or power storage units such as batteries and/or fuel cells configured to generate direct current electric power (DC).

These electrical rotating machines and power storage units are the electric power sources that form the single- or multiphase power supply network.

The power distribution network, which is connected to the electrical loads, is connected to the power supply network (and therefore to the power sources) via an electric power converter.

The power distribution network is a bipolar network delivering a high voltage direct current (HVDC).

Since the electric power sources are configured to generate a direct and/or alternating current, the electric power converter is a converter configured to operate either as a rectifier, that is, to convert AC electric power into DC electric power (HVAC/HVDC converter), or as a chopper, that is, to transform one DC electric power into another DC electric power (DC/HVDC converter).

It is also known that, in aircraft, the general electric network is provided with an electrical ground which is provided by the aircraft fuselage for metal-fuselage aircraft or by a mesh of electrical conductors, for example of the ESN or CRN type ("Electrical Structural Network" and "Current Return Network"), for aircraft with a fuselage made of a composite material.

Aircraft are known in which the neutral conductor of an electrical rotating machine (generator) is connected to the electrical ground by a neutral electric cable and the metal frames of the on-board systems (loads) are also connected to the electrical ground by ground electric cables.

Thus, the power supply and distribution networks are directly connected to the electrical ground.

When an electrical fault occurs in the general electric network, for example between one phase of the distribution network and the ground, a fault current having a large amplitude, which is greater than a rated current of the distribution network flows within a fault loop.

This fault loop comprises the faulty phase (from the converter to the load), the frame of the on-board systems corresponding to the electric load connected through this faulty phase, the electrical ground cable which connects these systems to the electrical ground of the aircraft, the electrical ground of the aircraft, the neutral electric cable which connects this ground to the neutral conductor of the electrical rotating machine and the phases of this machine (from the machine to the converter).

The protection of the general electric network of the aircraft, and therefore the safety of goods and persons, is ensured by electrical protection equipment configured to detect current surges and/or current leaks and for isolating the system or a portion of the faulty general electric network as close to the fault as possible.

Such electrical protection equipment is generally a circuit-breaker (CB), which may or may not be remotely controlled, or which may even be of the Solid-State Power Controller type (SSPC), or fuses as well as ground fault interrupters (GFI).

It should be noted that such electric power sources each have a substantial weight. It should further be noted that the neutral electric cable, which connects the electrical ground of the aircraft to the neutral conductor of each electrical rotating machine also has a substantial, non-negligible weight.

For obvious reasons of weight reduction, the possibility of isolating electric power sources in such a way that they would not be connected (and therefore not be referenced) to the electrical ground of the aircraft, is envisaged. For example, the neutral electric cable, which connects the neutral conductor of an electrical rotating machine and this ground, would be removed.

In this case, a stray capacitance would be generated between the neutral conductor of this electrical rotating machine and the electrical ground of the aircraft.

It should be noted that a stray capacitance between one or several phases of the power distribution network may also be created when a galvanically isolated electric power converter is used, in particular for coupling a DC electric power source of the power supply network to the power distribution network.

When an electrical fault between one phase of the power distribution network and the ground occurs, a small-amplitude fault current flows within a fault loop, which comprises only the stray capacitance(s). The amplitude of the fault current is small because the stray capacitance(s) has/have a high impedance.

Therefore, such a fault current will be difficult to detect using the electrical protection equipment employed in the case of electric power sources connected to the electrical ground of the aircraft, or in other words, of non-isolated sources, such as those described above. Indeed, the small amplitude of the fault current does not allow such electrical protection equipment to be tripped.

The protection of the general electric network of the aircraft, and therefore the safety of goods and persons, would thus not be ensured.

SUMMARY OF THE INVENTION

An object of the present invention is to provide a protection method and a protection device for aircraft, which are able to detect electrical faults in an electrical network of the aircraft, in particular if it is a bipolar power distribution network in which the power source supplying this bipolar network with power is isolated, or in other words, in which said source is not connected to an electrical ground of the aircraft.

The present invention thus relates, according to a first aspect, to a method for protecting an electrical network for aircraft, characterized in that said network is a bipolar power distribution network, which is supplied with electrical power by an electric power source of said aircraft, said electric power source is isolated from an electrical ground of said aircraft, said bipolar power distribution network comprises two phases and a resistive protection device, and is configured to be connected to said electrical ground of said aircraft and to the two phases of said bipolar power distribution network, wherein said method comprises the steps of:

receiving at least one voltage value on at least one of said two phases of said bipolar power distribution network and/or at least one current value in said electrical ground of said aircraft;

comparing said at least one voltage value with a first predetermined threshold value and/or said at least one current value with a second predetermined threshold value;

controlling said protection device by changing its resistivity according to said comparison.

The method according to the present invention is able to rapidly, accurately and highly reliably detect an electrical fault between a network phase and the electrical ground of the aircraft, despite the small amplitude of the fault current flowing through the current loop generated by the fault.

In order to detect such a fault in one phase of the bipolar power distribution network, upstream or downstream from the protection device, the method according to the present invention is based on a voltage measurement on this phase and/or a current measurement on the electrical ground of the aircraft, and more specifically between the ground and the resistive protection device.

It should be noted that taking the voltage of the faulty phase into account allows the faulty phase to be directly identified, since the voltage, which is then present on this phase, is representative of the fault.

It should also be noted that taking the current flowing through the electrical ground of the aircraft into account allows a fault in one of the phases to be identified, since the current which then flows in the electrical ground of the aircraft is representative of the fault. Indeed, when such a fault occurs, a leakage current flows from the connection device to the electrical ground of the aircraft.

It should further be noted that the method is configured to control the protection device in order to reduce the fault loop resistance, and thus increase the amplitude of the fault current.

The method according to the present invention is therefore highly efficient while at the same time remaining simple, convenient and cost effective.

According to the preferred, simple, convenient and cost-effective characteristics of the method according to the present invention:

said protection device is provided with a variable resistive system, wherein said method further comprises, before said receiving step, the step of controlling said variable resistive system so that it is balanced and has a first predetermined global resistance value, which allows an equilibrium point to be created on the power distribution network;

said protection device is provided with a variable resistive system and said step of controlling said protection device according to said comparison is performed by controlling said variable resistive system so that it is imbalanced and has a second predetermined resistance value and a third predetermined resistance value smaller than said second predetermined resistance value, which allows an imbalance to be created in the protection device so as to reduce the fault loop resistance and therefore increase the amplitude of the fault current (thereby possibly allowing power cut-off devices to be tripped);

said variable resistive system is formed by a bridge of variable resistive elements, which is provided with a first resistive element connected to said one phase of said bipolar power distribution network, a second resistive element connected to said other phase of said bipolar power distribution network and separate from said first resistive element, and a midpoint located between said first and second resistive elements and connected to said electrical ground of said aircraft, with said first predetermined global resistance value being representative of a first predetermined resistance value of each of said first and second resistive elements, thereby allowing the equilibrium point to be created in a simple manner on the power distribution network and thereby also allowing the current between the ground and a midpoint of the bridge of variable resistive elements to be measured;

said second predetermined resistance value is representative of the resistance value of said first or second resistive element, which is connected to the phase of said faulty bipolar power distribution network, and said third predetermined resistance value is representative of the resistance value of said first or second resistive element, which is connected to the other phase of said non-faulty bipolar power distribution network, thereby allowing current in the fault loop to be varied, either by keeping it below the rated current of the bipolar power distribution network, or by increasing it to a value greater than this rated current;

said second predetermined resistance value is greater or equal to said first predetermined resistance value, and said third predetermined resistance value is gradually decreased, thereby allowing current in the fault loop to be gradually varied;

said first predetermined threshold value is representative of a voltage of said electrical ground of said aircraft and the result of said step of comparing said first predetermined threshold value with said at least one voltage value is representative of the fact that said at least one voltage value is smaller or equal, in absolute value, to said first predetermined threshold value when a fault is present on said one phase of said bipolar power distribution network;

said second predetermined threshold value is representative of a current value in said electrical ground of said aircraft when no fault is present, that is, when it is approximately equal to zero, and the result of said step of comparing said second predetermined threshold value with said at least one current value is representative of the fact that said current value is positive or negative and greater, in absolute value, than said second predetermined threshold value when a fault is present on said one phase of said bipolar power distribution network; and/or said bipolar power distribution network further comprises at least one power cut-off device and said method further comprises the step of tripping said power cut-off device.

Another object of the present invention, according to a second aspect, relates to a protection device in an electrical network for aircraft, characterized in that said network is a bipolar power distribution network comprising two phases, which is supplied with electrical power by an electric power source of said aircraft, said electric power source is isolated from an electrical ground of said aircraft, said protection device is resistive, is configured to be connected to said electrical ground of said aircraft and to the two phases of said bipolar power distribution network and comprises a control and operating unit configured for:

receiving at least one voltage value on at least one of said two phases of said bipolar power distribution network and/or at least one current value in said electrical ground of said aircraft;

comparing said at least one voltage value with a first predetermined threshold value and/or said at least one current value with a second predetermined threshold value;

controlling said protection device by changing its resistivity according to said comparison.

The device according to the present invention is able to rapidly, accurately and highly reliably detect an electrical fault between a network phase and the electrical ground of the aircraft, in spite of the small amplitude of the fault current flowing through the current loop generated by the fault.

In order to detect such a fault in one phase of the bipolar power distribution network, upstream or downstream from the protection device, the device according to the present invention is based on a voltage measurement on this phase and/or on a current measurement on the electrical ground of the aircraft, specifically between the ground and the resistive protection device.

It should be noted that by taking the voltage of the faulty phase into account it is possible to directly identify the faulty phase since the voltage which then flows through this phase is representative of the fault.

It should also be noted that by taking the current through the electrical ground of the aircraft into account it is possible to identify that a fault is present on one of the phases, since the current which then flows into the electrical ground of the aircraft is representative of the fault. Indeed, when such a fault occurs, a leakage current flows from the connection device to the electrical ground of the aircraft.

It should further be noted that the unit is configured to control the protection device so as to reduce the fault loop resistance, and thus increase the amplitude of the fault current.

The device according to the present invention is therefore highly efficient while being simple, convenient and cost effective.

According to preferred, simple, convenient and cost-effective characteristics of the device according to the present invention:

it comprises a variable resistive system and said control and operation unit is configured for, before receiving at least one voltage value and/or at least one current value, controlling said variable resistive system so that it is balanced and has a first predetermined global resistance value, thereby allowing an equilibrium point to be created on the power distribution network;

it comprises a variable resistive system and said control and operation unit is configured to control said variable resistive system so that it is imbalanced and has a second predetermined resistance value and a third predetermined resistance value smaller than said second predetermined resistance value, thereby allowing an imbalance to be created in the protection device so as to reduce the fault loop resistance and therefore increase the amplitude of the fault current (thereby possibly tripping power cut-off devices);

said variable resistive system is formed by a bridge of variable resistive elements, which is provided with a first resistive element connected to said one phase of said bipolar power distribution network, a second resistive element connected to said other phase of said bipolar power distribution network and separate from said first resistive element, and a midpoint located between said first and second resistive elements and connected to said electrical ground of said aircraft, with said first predetermined global resistance value being representative of a first predetermined resistance value of each of said first and second resistive elements, thereby allowing the equilibrium point to be created in a simple manner on the power distribution network and thereby also allowing the current between the ground and a midpoint of the bridge of variable resistive elements to be measured;

said second predetermined resistance value is representative of the resistance value of said first or second resistive element, which is connected to the phase of said faulty bipolar power distribution network, and said third predetermined resistance value is representative of the resistance value of said first or second resistive element, which is connected to the other phase of said non-faulty bipolar power distribution network, thereby allowing current in the fault loop to be varied, either by keeping it below the rated current of the bipolar power distribution network, or by increasing it to a value greater than this rated current;

said second predetermined resistance value is greater or equal to said first predetermined resistance value, and said third predetermined resistance value is gradually decreased, thereby allowing current in the fault loop to be gradually varied; and/or said device further comprises measurement instruments configured to perform voltage value measurements on said two phases of said bipolar power distribution network and/or current value measurements in said electrical ground of said aircraft.

Another object of the present invention also relates, according to a third aspect, to an aircraft comprising an electrical network, an electric power source configured to supply electric power to said electrical network and an electrical ground, characterized in that said electric power source is isolated from said electrical ground, and said network is a bipolar power distribution network, which further comprises at least one protection device such as described above.

According to preferred, simple, convenient and cost-effective characteristics of the aircraft according to the present invention:

it further comprises a power supply network, which includes said electric power source, which power supply network is connected to said bipolar power distribution network via an electric power converter;

said electric power source is formed by a three-phase electrical rotating machine configured to operate as a variable-frequency generator and generate an alternating current, and said electric power converter is formed by a three-phase rectifier configured to convert AC electric power into DC electric power; and/or said electric power source is formed by a power storage unit configured to generate a direct current, and said electric power converter is formed by a chopper configured to convert DC electric power having a first amplitude into another DC electric power having a second amplitude greater than said first amplitude.

BRIEF DESCRIPTION OF THE DRAWINGS

The present invention will now be disclosed further through the description of an embodiment, given below by way of non-limiting illustration, with reference to the appended drawings, in which.

DETAILED DESCRIPTION OF THE PREFERRED EMBODIMENTS

Figure 1:
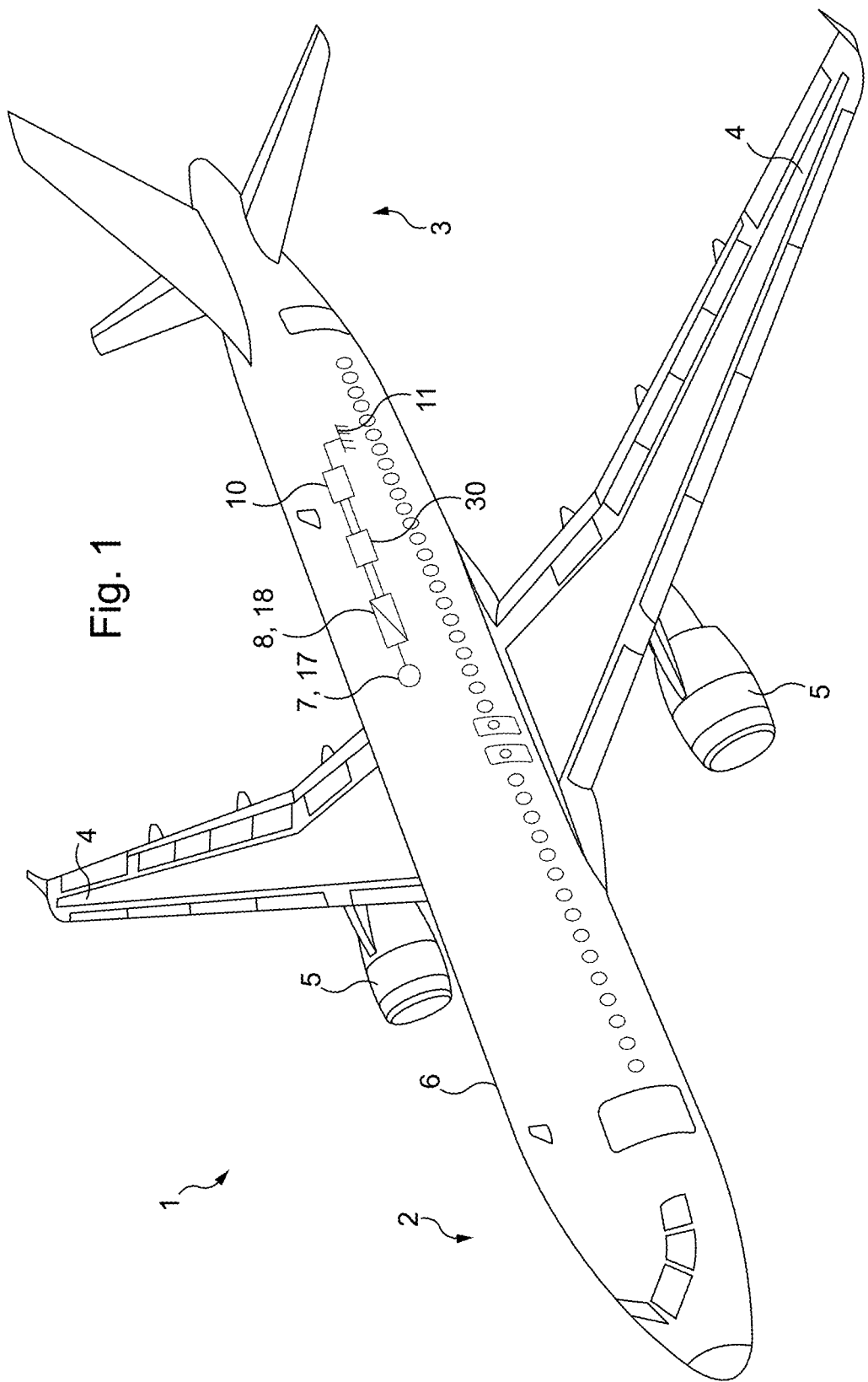
FIG. 1 shows a schematic and perspective view of an aircraft, which is provided, in particular, with a protection device according to the present invention.

FIG. 1 illustrates an aircraft 1 provided with a fuselage 6, which has a forward section 2 and a tail section 3, wings 4 each joined to fuselage 6 at a central portion thereof, and two engines 5, with these engines 5 each being attached to a smaller wall of a respective wing 4 and extending from the respective wing 4 parallel to the fuselage 6 toward the forward section 2 of aircraft 1.

Said aircraft 1 further comprises a general electric network 12 comprising a power supply network 14 connected to a bipolar power distribution network 13 (FIGS. 2 and 3) via a electric power converter 8, 18.

The power supply network 14 is provided with several single-phase and/or multi-phase power supply sources conventionally formed by electrical rotating machines 7 and by power storage units 17 such as batteries or fuel cells.

The bipolar power distribution network 13 is provided with a distribution bus 9 (FIGS. 2 and 3) connected to converter 8, 18 and with a plurality of single-phase and/or multi-phase electrical consumption sources 10, also referred to, respectively, as electrical loads.

It should be noted that these electrical loads 10 are formed by on-board systems of the aircraft 1.

The electrical loads, and more specifically their metal frames, are all connected to an electrical ground 11 of the aircraft 1.

This electrical ground 11 is here formed by the metal fuselage 6 of the aircraft 1. It should be noted that in the case where the aircraft fuselage is made of a composite rather than a metal, then the electrical ground of the aircraft is formed by a mesh of electrical conductors, for example of the ESN or CRN type (Electrical Structural Network and Current Return Network, respectively), which this aircraft comprises.

The bipolar power distribution network 13 is furthermore provided with a protection device 30 configured to detect possible electrical faults in the general electric network 12 and for controlling the tripping of power cut-off devices 40a to 40e (FIGS. 6 to 10) in the case of an electrical fault.

Figure 2:
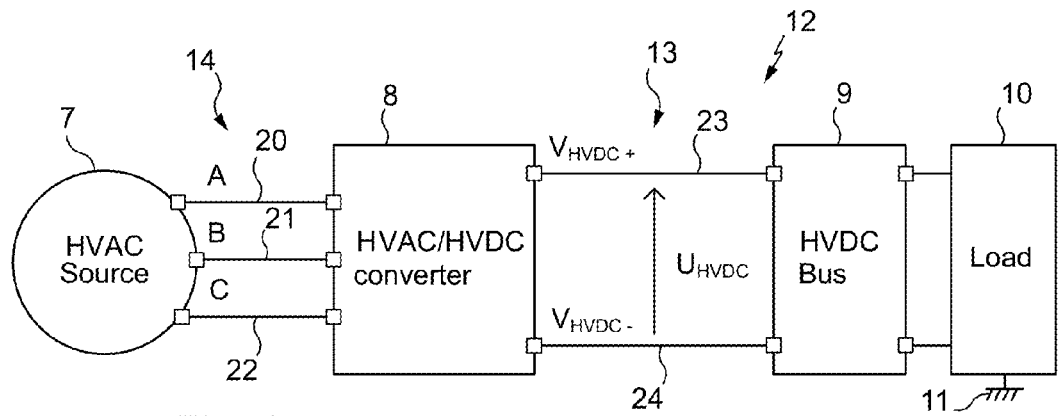
FIGS. 2 and 3 show a schematic and partial view of a general electric network of the aircraft, provided with a controlled and isolated electric power source, formed by a three-phase electrical rotating machine and a rectifier, and by a power storage unit and a chopper, respectively.

FIG. 2 illustrates a general electric network 12 in more detail.

The electric power source is here formed by a three-phase electrical rotating machine 7 configured to operate in a generator mode and for delivering a high-voltage alternating current.

The power supply network 14 is therefore provided here with three phases 20, 21 and 22, also designated A, B and C, which connect the generator 7 to converter 8, here being formed by a rectifier configured to convert the AC electric power delivered by the generator 7 into DC electric power supplied to the bipolar power distribution network 13.

This converter is referred to here as a HVAC/HVDC rectifier 8, (High Voltage Alternative Current/High Voltage Direct Current).

Figure 10:
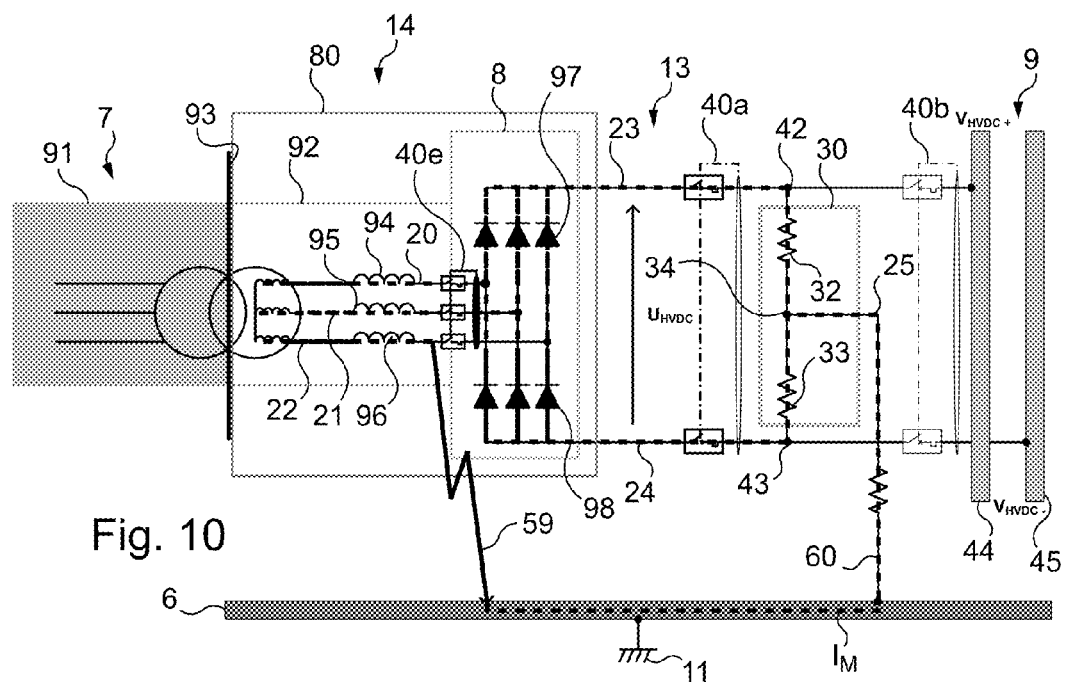

It should be noted that generator 7 more specifically comprises a primary 91 and a secondary 92 (FIG. 10). Here, the three phases 20, 21 and 22 are derived from the secondary 92 of the generator 7.

The bipolar power distribution network 13 is here formed of two phases 23 and 24 each at an electric potential with respect to the electrical ground 11 designated VHVDC+ and VHVDC−, respectively.

Across these two phases 23 and 24, the bipolar power distribution network 13 has an inter-phase voltage called UHVDC.

These two phases 23 and 24 connect the HVAC/HVDC converter 8 to the bus 9, here designated HVDC bus.

Here, this HVDC bus 9 is a distribution bus to which the electrical loads 10 are connected.

Figure 6:
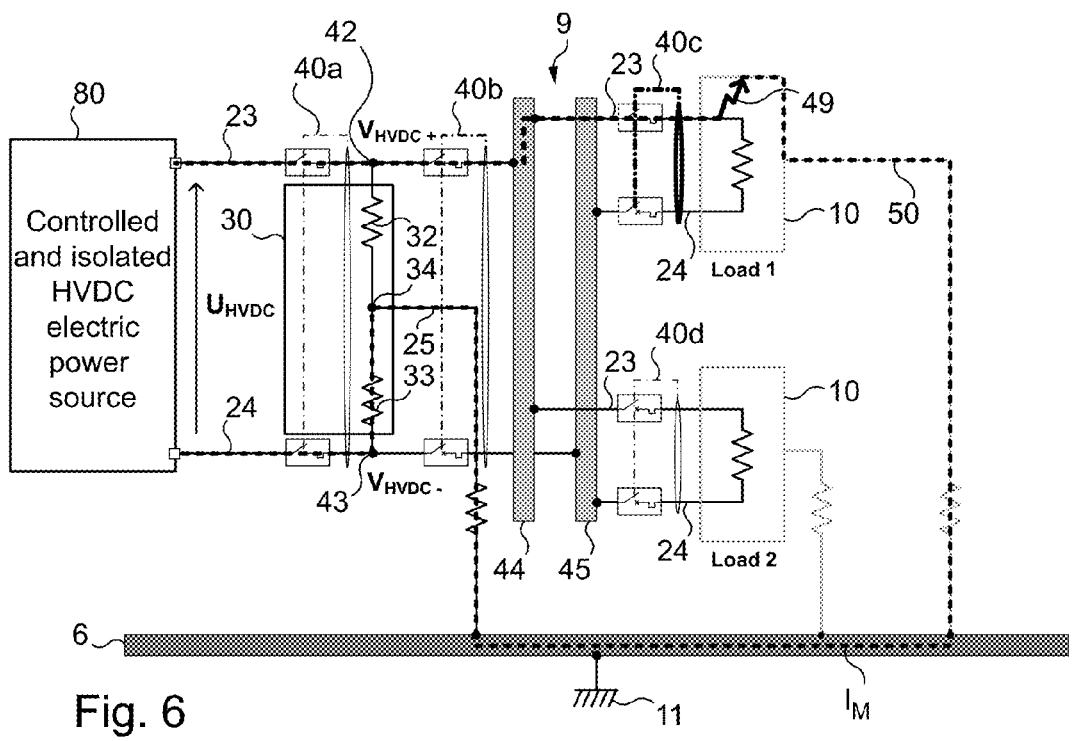
FIGS. 6 to 10 are views similar to that of FIG. 5, each illustrating one or several faults in the general electric network of the aircraft.

As is more clearly shown in FIG. 6, each electrical load 10 is connected to the two phases 23 and 24 through two busbars 44 and 45 included in HVDC bus 9, with the busbar 44 being connected to phase 23 and the busbar 45 being connected to phase 24.

Each of the electrical loads 10 is furthermore directly connected, via its metal frame, to the electrical ground 11 of the aircraft 1.

Figure 3:
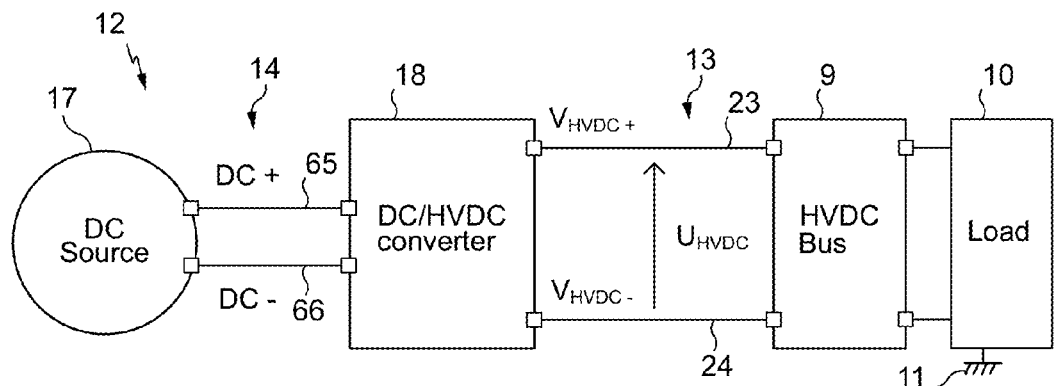

FIG. 3 is similar to FIG. 2, except that the electric power source is here a power storage unit 17, which, in particular, is formed by a battery.

This battery 17 is configured to deliver a direct current.

As for the power supply network 14, this is provided with two phases 65 and 66, also designated DC+ and DC−, which connect the battery 17 to the electric power converter 18, which, here, is a chopper.

This chopper 18 is configured to convert the DC electric power from the battery 17, which power has an average amplitude, referred to as the first amplitude, into another DC electric power having a large amplitude, referred to as the second amplitude, which is greater than the first amplitude.

This converter 18, here, is referred to as a DC/HVDC chopper (Direct Current/High Voltage Direct Current).

As for the bipolar power distribution network 13, this is identical to that shown in FIG. 2.

Figure 4:
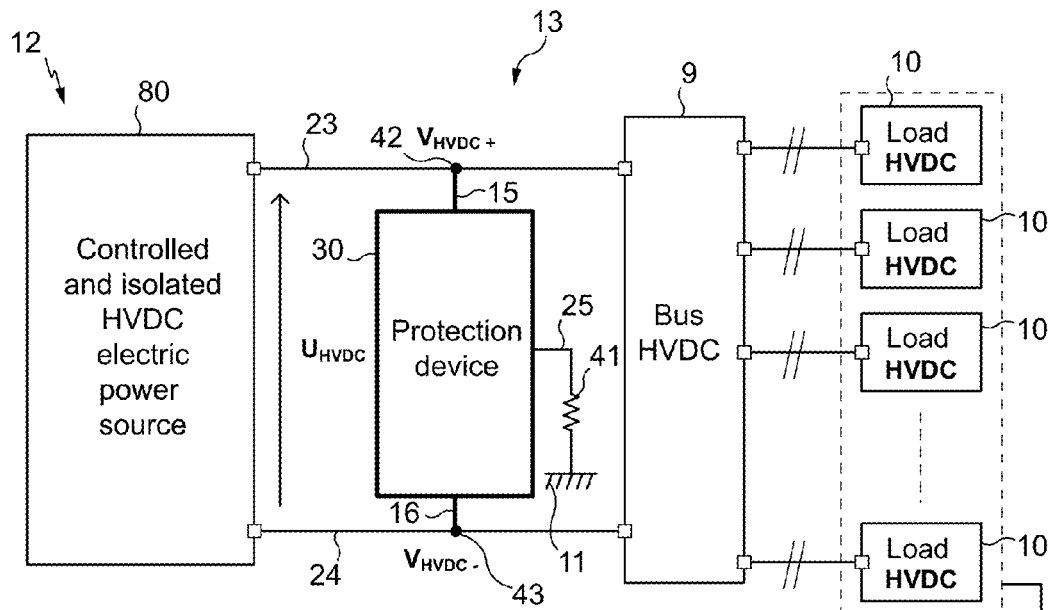
FIG. 4 shows a schematic and partial view of a power distribution network of the general electric network shown in FIGS. 2 and 3, provided with the protection device shown in FIG. 1, which, here, is arranged between the controlled power source and a distribution bus.

It should be noted that the groups formed on the one hand by the secondary of the generator 7, the three phases 20, 21 and 22, as well as the rectifier HVAC/HVDC 8, and on the other hand, by the battery 17, the two phases 65 and 66, as well as the DC/HVDC chopper 18, each form a controlled and isolated electric power source 80 (FIG. 4). It should be noted that by "controlled" it is meant that the voltage of the electric power source is regulated.

It may indeed be seen that in FIGS. 2 and 3, neither the electric power source 7, 17 nor the converter 8, 18 is connected (that is, directly connected) to the electrical ground 11 of the aircraft 1.

FIG. 4 represents the general electric network 12 in a simplified manner on the side of power supply network 14 by showing the controlled and isolated electric power source 80, while the bipolar power distribution network 13 is shown in more detail.

The bipolar power distribution network 13 is provided with a protection device 30 arranged between the controlled and isolated electric power source 80 and the HVDC bus 9.

This protection device 30 is directly connected to the phase 23 and therefore to voltage VHVDC+ at a connection point 42 via an electric cable 15, and to the phase 24 and therefore to voltage VHVDC− by a connection point 43 via a cable 16.

The protection device 30 is furthermore directly connected to the electrical ground 11 of the aircraft 1 via an electric cable 25.

It may be seen that between this protection device 30 and the electrical ground 11 there is a resistive element 41 which represents the impedance of the cable 25.

It should be noted that the electrical links shown in FIG. 4 between the HVDC bus 9 and the electrical loads 10, also designated HVDC loads, are provided with two slightly inclined lines representing a bipolar connection (namely a respective extension of the phases 23 and 24 through the busbars 44 and 45 of the HVDC bus 9).

Figure 5:
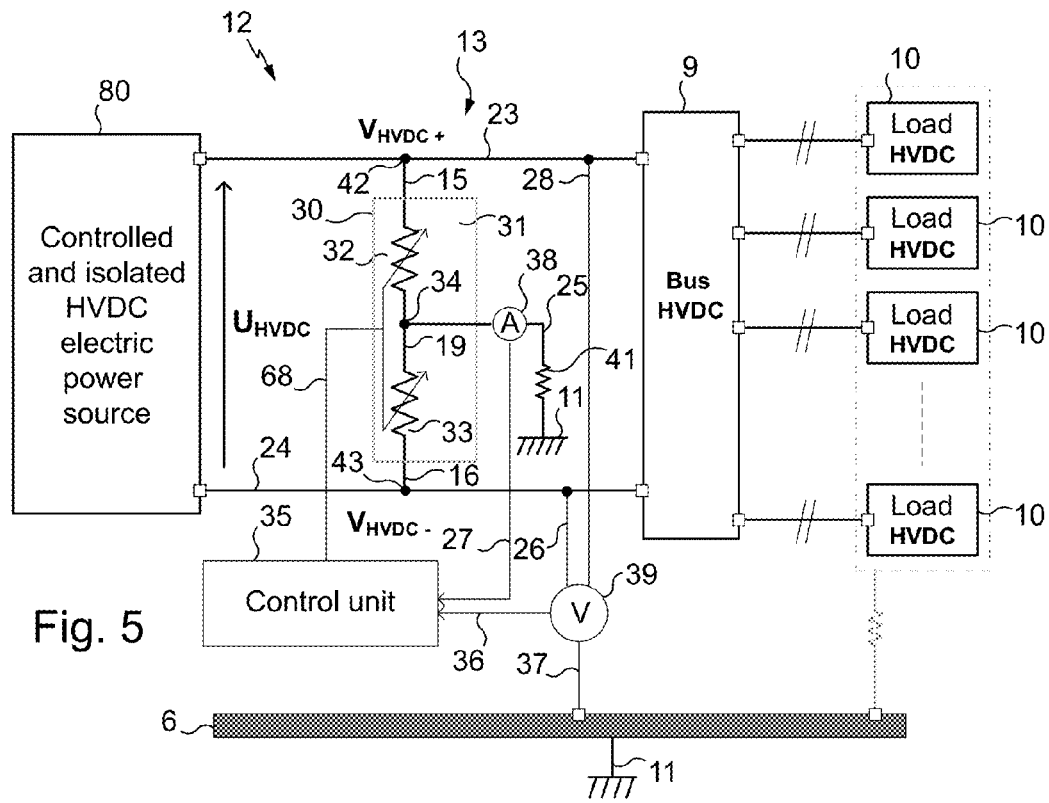
FIG. 5 is a view similar to that of FIG. 4, showing the protection device in detail.

FIG. 5 is similar to FIG. 4, except that the protection device 30 is shown in detail.

It should be noted that FIG. 5 also shows a schematic view of the metal fuselage 6 of the aircraft 1 forming the electrical ground 11.

The protection device 30 comprises a variable resistive system 31 as well as a control and operating unit 35 configured to control this variable resistive system 31.

This control and operation unit 35 comprises a microprocessor (not shown) provided with a memory (not shown), in particular, of the non-volatile type, allowing it to load and store information and software, which, when executed in the microprocessor, make it possible to implement a protection method.

This non-volatile memory is for example of the ROM type (Read-Only Memory).

The control and operating unit 35 further comprises a memory (not shown), in particular, of the volatile type, for storing data while the software is being executed and the method is being implemented.

This volatile memory is for example of the RAM or EEPROM type (Random Access Memory and Electrically Erasable Programmable Read-Only Memory, respectively).

This control and operation unit 35 may for example include a microcontroller or an ASIC ("Application-Specific Integrated Circuit").

The variable resistive system 31 comprises a first variable resistive element 32 and a second variable resistive element 33, which is connected to the first variable resistive element 32 via an electric cable 19.

The first variable resistive element 32 is connected at a first end to the cable 15, itself connected to a connection point 42 on the phase 23, and at its second end, which is opposite to the first end, to the electric cable 19.

As for the second variable resistive element 33, this is connected at a first end to the electric cable 16, itself connected to a connection point 43 on the second phase 24, and at its second end, which is opposite to the first end, to the electric cable 19.

The electric cable 25 connected to the electrical ground 11 of the aircraft 1 is connected to the electric cable 19 at a connection point 34 referred to as the midpoint between the first and second resistive elements 32 and 33 of the variable resistive system 31.

The general electric network 12 further comprises measurement instruments configured to perform measurements of voltage values VHVDC+ and VHVDC− on the two phases 23 and 24 of the bipolar power distribution network 13 and measurements of ground current values, designated IM, in the electrical ground 11 of the aircraft 1.

More specifically, these include a set of voltage sensors combined into a voltmeter 39, which is connected to the fuselage 6 and therefore to the electrical ground 11 of the aircraft 1 by an electric cable 37, to the phase 23 by an electric cable 28, to the phase 24 by an electric cable 26 as well as to the control and operating unit 35 by a cable 36.

These further include an ammeter 38 on the electric cable 25 which connects the midpoint 34 of the variable resistive system 31 to the electrical ground 11 of the aircraft 1, which ammeter 38 is connected to the control and operating unit 35 via an electric cable 27.

It should be noted that the respective connections between the control and operating unit 35 and the ammeter 38 and the voltmeter 39 allow the control and operating unit 35 to control measurements to be performed by the ammeter 38 and the voltmeter 39 and also to receive the measured data through the electric cables 27 and 36, respectively.

For example, these measurements are performed at predetermined time intervals.

It should further be noted that the control and operating unit 35 is connected to the first and second resistive elements 32 and 33 via an electric cable 68, for controlling the first and second resistive elements 32 and 33.

It should further be noted that the variable resistive system 31 here forms a variable resistance bridge whose midpoint 34 is directly connected to the electrical ground 11 of the aircraft 1.

As will be seen hereafter in more detail, the general electric network 12 of the aircraft 1 is provided with a plurality of power cut-off devices 40a to 40e arranged both in the power supply network 14 and in the bipolar power distribution network 13.

More specifically, it may be seen that in FIGS. 6 to 9, the bipolar power distribution network 13 comprises a cut-off device 40a arranged between the controlled and isolated electric power source 80 and the protection device 30. This cut-off device 40a is configured to actuate a power cut-off on one or the other of the phases 23 and 24, or even both.

The bipolar power distribution network 13 is furthermore provided with a cut-off device 40b arranged between the protection device 30 and the distribution bus 9. This cut-off device 40b is configured to actuate a cut-off on one or the other of the phases 23 and 24, or even both.

The bipolar power distribution network 13 is furthermore provided with power cut-off devices 40c and 40d each arranged between the distribution bus 9 and the electrical load 10. These two power cut-off devices 40c and 40d are configured to actuate a cut-off on at least one of the phases 23 and 24, or even both.

As more clearly shown in FIG. 10, the power supply network 14 is itself provided with a cut-off device 40e arranged between the secondary 92 of the generator 7 and the rectifier 8. This cut-off device 40e is configured to actuate a cut-off on at least any one of the phases 20, 21 and 22.

It should be noted that, here, these power cut-off devices 40a to 40e are formed preferably by ground fault interrupters (GFIs).

The control and operating unit 35 is, as mentioned above, configured to carry out the steps of a method for protecting the general electric network 12, in particular the steps of first detection, actual detection and clarification of possible faults between one phase in the power supply network 14 or in the bipolar power distribution network 13 and the electrical ground 11 of the aircraft 1.

Figure 12:
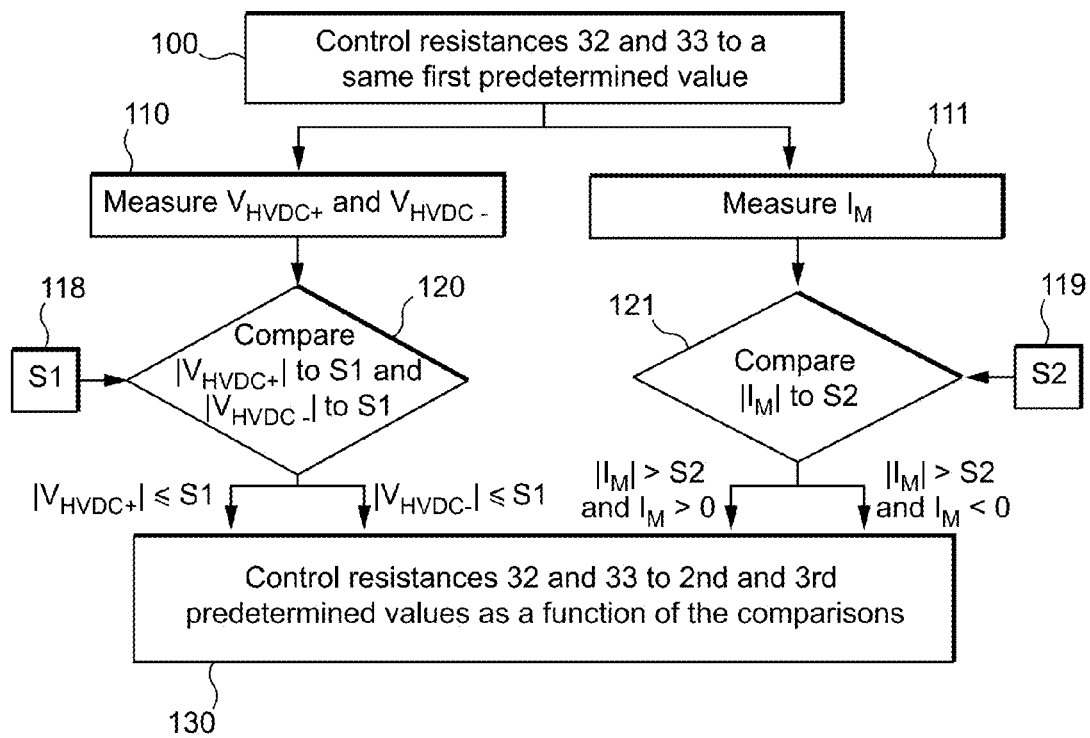
FIG. 12 is a block diagram illustrating different operating steps of a protection method employed by the protection device shown in FIG. 5.

A more detailed description will now be provided of the protection method with reference to FIG. 12.

The control and operating unit is configured to set, at step 100, the variable resistance system 31, in particular the resistivity value of the first and second resistive elements 32 and 33, at a substantially same first predetermined value.

Here, this first predetermined resistance value is high so that the protection device 30 consumes an only negligible amount of electric power.

It should be noted that the first and second resistive elements 32 and 33 have the same resistivity value, also referred to as the first predetermined global resistance value, so as to form a balanced bridge.

The control and operating unit 35 is furthermore configured to receive information that, here, directly represents, the measured values of the voltages of the phases 23 and 24, namely VHVDC+ and VHVDC−, at step 110, and of the ground current IM at the output of the protection device 30, in particular between the midpoint 34 and the electrical ground 11 of the aircraft 1, at step 111.

It should be noted, as mentioned above, that voltage VHVDC+ and voltage VHVDC− are measured by means of the voltmeter 39, while current IM is measured by means of the ammeter 38.

The control and operating unit 35 is configured for comparing, at step 120, the value of voltage VHVDC+ and the value of voltage VHVDC− to a first predetermined threshold value S1 previously received by the control and operating unit 35 at step 118.

It should be noted that this first predetermined threshold value S1 is representative of a voltage of the electrical ground 11 of the aircraft 1 when a fault occurs on the phases or in the power supply network 14 as well as in the bipolar power distribution network 13.

The result of this comparison of this first predetermined threshold value S1 using the voltage values VHVDC+ and VHVDC− (in absolute values) is representative of whether or not a fault has occurred in the relevant phase.

This is due to the fact that when a phase is faulty, because of the small fault impedance (combined with the high resistivity of variable resistive system 31), the voltage of the faulty phase approaches the voltage of the electrical ground 11, which characterizes a fault between the relevant phase and the electrical ground 11.

The result of this comparison thus has the advantage of directly identifying the faulty phase, in the case, of course, where the voltage sensor of voltmeter 39 involved in the detection is known.

The control and operating unit 35 is furthermore configured for comparing, at step 121, the value representing the ground current IM flowing through the electric cable 25 between the midpoint 34 of the resistive system 31 and the electrical ground 11, with a second predetermined threshold value S2 previously received by the control and operating unit 35 at step 119.

It should be noted that this second predetermined threshold value is representative of a current value in the electrical ground 11 of the aircraft 1 when a fault occurs, that is, it is a non-zero value.

The result of this comparison of the second predetermined threshold value S2 with current value IM is representative of whether or not a fault has occurred in the relevant phase.

This comparison information is furthermore characterized by the sign of the (positive or negative) current value IM, thereby allowing the faulty phase to be identified.

This is due to the fact that when a fault between one phase and the electrical ground 11 occurs, a leak current flows through midpoint 34 of variable resistive system 31 to the electrical ground 11 of the aircraft 1.

If the current value IM is positive and greater than S2 (in absolute value), then it is the phase 23, representative of voltage VHVDC+, which is faulty, whereas if this value is negative and greater than S2 (in absolute value), then it is the phase 24, representative of voltage VHVDC−, which is faulty.

This result is of course representative of the arrangement and configuration of the phases 23 and 24 with respect to the variable resistive system 31, in particular with respect to the first and second resistive elements 32 and 33 and to the midpoint 34.

The control and operating unit 35 is furthermore configured to control, at step 130, the resistivity of the first and second resistive elements 32 and 33 of the variable resistive system 31 according to the comparisons performed at steps 120 and 121.

In the case of a fault on the phase 23, the comparison result at step 120 indicates that voltage VHVDC+ is smaller or equal (in absolute value) to the first predetermined threshold value S1; and/or the comparison result at step 121 indicates that the current value IM is positive and greater (in absolute value) than the second predetermined threshold value S2.

Then, the control and operating unit 35 sets at step 130 the resistivity value of the first and second resistive elements 32 and 33 accordingly. More specifically, the resistivity value of first resistive element 32 is set to a second predetermined resistance value, which, here, is maximum and therefore greater than the first predetermined resistance value, and the resistivity value of the second resistive element 33 is gradually decreased.

It should be noted that the resistivity value of the first resistive element 32 is not necessarily set to the maximum predetermined resistance value, and that, alternatively, when the resistivity value of the second resistive element 33 is gradually decreased, the resistivity value of first resistive element 32 is increased, for example gradually.

In the case of a fault on the phase 24, the comparison result at step 120 indicates that potential VHVDC− is smaller or equal (in absolute value) to the first predetermined threshold value S1; and/or the comparison result at step 121 indicates that the current value IM is negative and greater (in absolute value) than the second predetermined threshold value S2.

Then, the control and operating unit 35 sets at step 130 the resistivity value of the first and second resistive elements 32 and 33 accordingly. More specifically, the resistivity value of the second resistive element 33 is set to a second predetermined resistance value, which, here, is maximum and therefore greater than the first predetermined resistance value, and the resistivity value of the first resistive element 32 is gradually decreased.

It may be seen that, here, the control and operating unit 35 is therefore configured to set the resistivity value of the first and second resistive elements 32 and 33 independently and measure potentials VHVDC+ and VHVDC−, as well as current IM by means of voltage and current sensors.

It should be noted that, according to the logic of varying the resistivity value of variable resistive system 31, as mentioned above, the current IM flowing through the fault loop is increased gradually so as to allow at least one cut-off device 40a to 40e to be tripped, as will be seen hereafter in more detail.

It should also be noted that the power cut-off devices 40a to 40e are selected so as to be tripped or to automatically trip as a function of a current threshold value smaller or greater than a rated current of the bipolar power distribution network 13.

The tripping of the power cut-off devices 40a to 40e can of course avoid current surges in the electric cables of the phases and on-board systems.

It should be noted that the above described method can clearly identify the faulty phase and therefore can control the variable resistive system 31 by creating an appropriate imbalance in the latter so as to reduce the fault loop resistance, and thus increase the amplitude of the fault current and allow power cut-off devices 40a to 40e to be tripped.

Referring to FIGS. 6 to 10, examples of faults that can be detected when carrying out the above described protection method using the protection device 30, also described above, will now be described.

FIG. 6 illustrates the case of a fault between the phase 23, at potential VHVDC+, and the electrical ground 11 in the electric load 10, designated load 1.

When a fault occurs on this phase 23, the voltage of the latter approaches the zero potential and a positive direct current IM of small amplitude flows through the cable 25 which connects the midpoint 34 of the protection device 30 to the electrical ground 11 of the aircraft 1. The fault current loop 50, shown by a solid line in FIG. 6, in which the fault current flows, comprises the phase 23, the busbar 44 of the bus 9 and the metal frame of the faulty load 10, with the fault on the electrical load 10 being shown by an arrow 49. The fault current loop 50 further comprises the cable, which includes a resistive element connecting this faulty electrical load 10 to the electrical ground 11 of the aircraft 1.

The fault current loop 50 further comprises the fuselage 6 of the aircraft 1 forming the electrical ground 11, the electric cable 25 connecting the electrical ground 11 to midpoint 34, the second resistive element 33 of the protection device 30 and the phase 24 between the connection point 43 and the controlled and isolated electric power source 80.

The fault is detected by measuring and comparing the potential VHVDC+ and/or current IM.

The control and operating unit 35 thus controls the decrease in the resistivity value of the second resistive element 33 and the setting at a high resistivity value of the first resistive element 32.

The decrease in the resistivity value of the second resistive element 33 is gradual, so that the amplitude of the fault current in the fault loop 50 can be gradually increased until it exceeds a predetermined tripping threshold of the cut-off device 40c arranged between the bus 9 and the faulty electric load 10, that is, closest to the fault.

Once the cut-off device 40c has been tripped, the fault is isolated, the general electric network 12 is protected and the safety of goods and persons is thus ensured.

It should be noted that for a fault that is similar but is located in the electrical load 10, designated load 2, or even in both electrical loads 10 illustrated in FIG. 6, the same variation control of the resistivity value of the first and second resistive elements 32 and 33 of the protection device 30 is implemented so as to allow tripping of the cut-off device 40d if the fault is located on the load 2 only or the tripping of both power cut-off devices 40c and 40d if the fault is located on both electrical loads 10.

Figure 7:
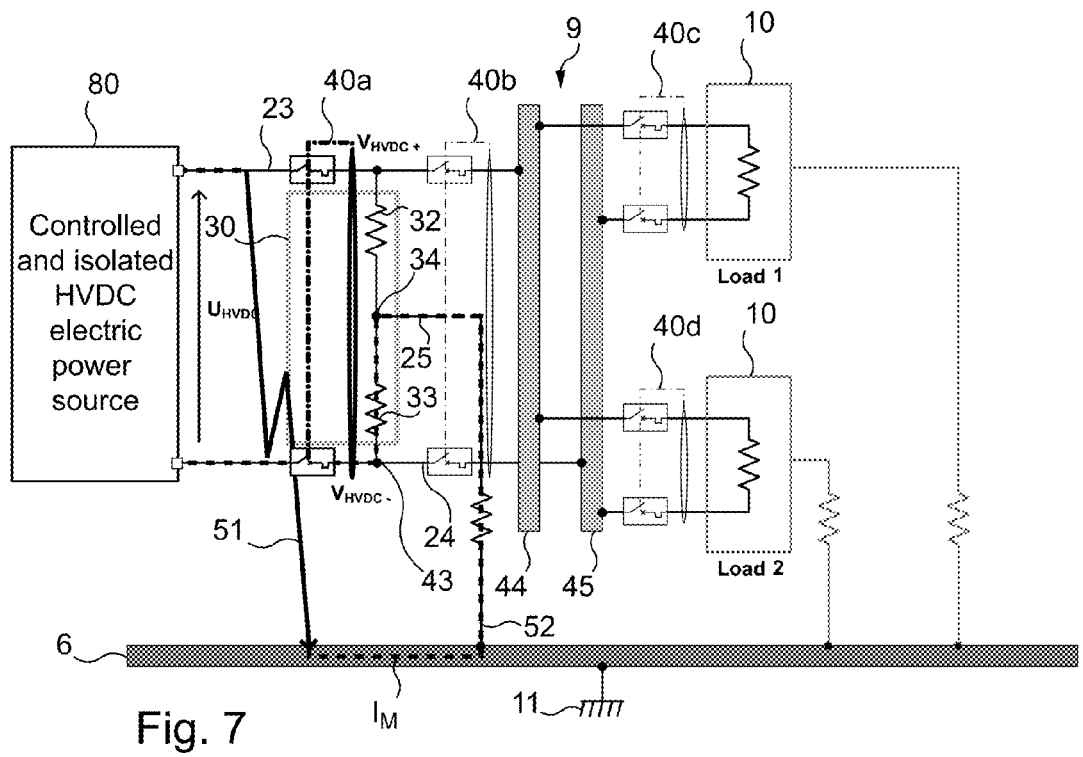

FIG. 7 illustrates a fault on the phase 23 with respect to the electrical ground 11 upstream of the protection device 30, or in other words, between the controlled and isolated electric power source 80 and this protection device 30. Here, the fault loop 52 through which the fault current flows comprises a portion of the phase 23 between the controlled and isolated electric power source 80 and the location of the fault shown by an arrow 51, the fuselage 6, the electric cable 25, which connects the midpoint 34 of protection device 30 to the electrical ground 11, the second resistive element 33 and the phase 24 between the connection point 43 and the controlled and isolated electric power source 80.

The same variation control of the resistivity value of the first and second resistive elements 32 and 33 of the protection device 30 as that described for FIG. 6 is implemented in order to increase the fault current (through a controlled gradual decrease in the resistivity value of the second resistive element 33) until tripping of the cut-off device 40a (closest to the fault) is enabled.

Once the cut-off device 40a has been tripped, the electrical network downstream from the fault is protected and the safety of goods and persons is thus ensured. The fault itself is not entirely isolated because it is still present in the controlled and isolated electric power source 80. The tripping of the cut-off device 40a allows such a fault to be identified as being present upstream of the protection device 30, and for the purposes of isolating this fault, it is necessary to isolate the power source itself by acting upon a protection system (not shown) dedicated to said power source.

Figure 8:
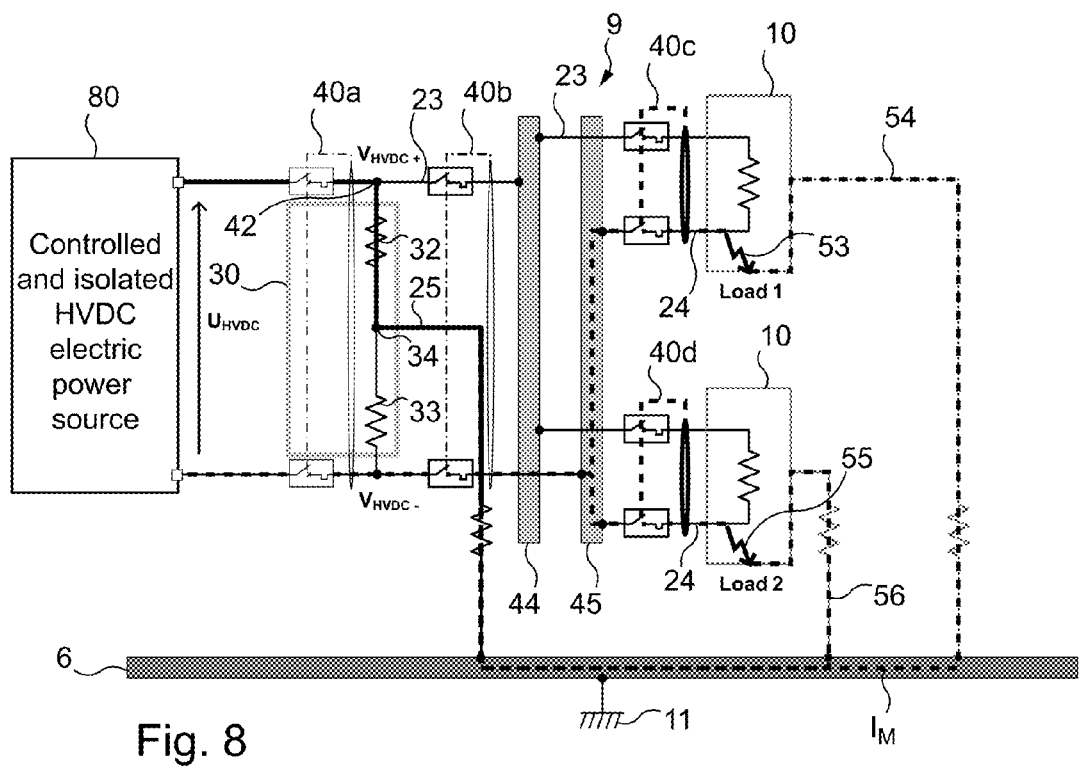

FIG. 8 illustrates the case of a fault on the phase 24, that is, at voltage VHVDC−, in both electrical loads 10 illustrated in FIG. 8.

In this case, the voltage of the phase 24 approaches the zero potential and a negative direct current of small amplitude flows through the electric cable 25 connecting the midpoint 34 of the protection device 30 to the electrical ground 11 of the aircraft 1.

The control and operating unit 35 therefore detects the fault on this phase 24.

Here, the fault current loop 54, 56 through which the fault current flows comprises the phase 24, from the controlled and isolated electronic power source 80 to the two electrical loads 10, including the two busbars 44 and 45 of the bus 9.

The fault loop portion 54 comprises the metal frame of the electric load 10, designated load 1, because of the fault represented by arrow 53, as well as the electric cable, which connects this frame to the electrical ground 11.

The fault loop portion 56 further comprises the metal frame of the electric load 10, designated load 2, because of the fault shown by arrow 55, as well as the electric cable, which connects this load to the electrical ground 11.

The fault loop 54, 56 further comprises the fuselage 6, the electric cable 25, which connects the midpoint 34 of the protection device 30 to the fuselage 6 and therefore to the electrical ground 11, the first resistive element 32 of this protection device 30 and a portion of the phase 23 between the connection point 42 and the controlled and isolated electric power source 80.

The fault is thus detected by the control and operating unit 35, which controls the resistivity variation of the variable resistive system 31 by gradually decreasing the resistivity value of the first resistive element 32 and by setting the resistivity value of the second resistive element 33 to a high value.

This allows the amplitude current in fault loop 54, 56 to be gradually increased, and thus allows the power cut-off devices 40c and 40d closest to both faults, to be tripped.

Once the power cut-off devices 40c and 40d have been tripped, the fault is isolated, the general electric network 12 is protected and the safety of goods and persons is thus ensured.

It should be noted that the same logic for varying the resistivity of the variable resistive system 31 is implemented by the control and operating unit 35 in the case where the fault is not located on the two loads illustrated in FIG. 8 but on just one of the loads illustrated in this Figure. In this case, it should be noted that the fault loop does not include the two electric cables connecting the respective loads to the ground 11 but only one of these cables. Furthermore, only one of the power cut-off devices 40c or 40d is tripped, namely that which is located closest to the fault.

Figure 9:
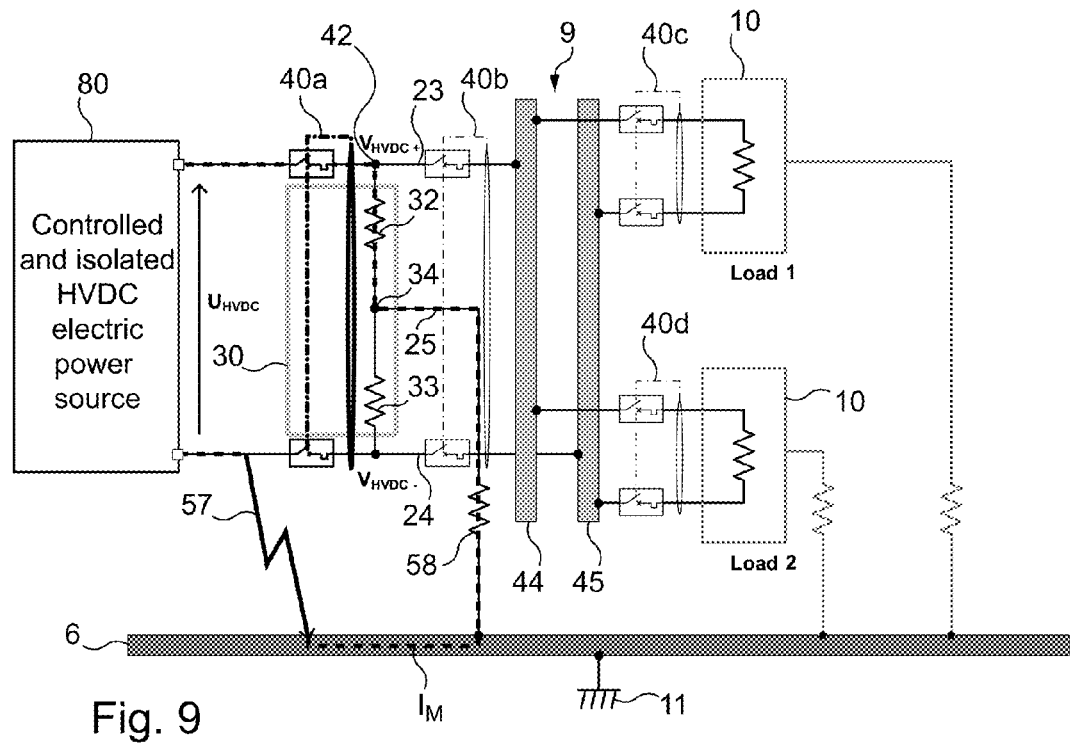

FIG. 9 illustrates the case of a fault similar to the fault illustrated in FIG. 7, except that this fault, which is located upstream of the protection device 30, in particular between the latter and the controlled and isolated electric power source, originates from the phase 24.

Here, the fault loop 58 comprises the portion of the phase 24 which is located between the controlled and isolated electric power source 80 and the location of the fault illustrated by the arrow 57, the fuselage 6 of the aircraft 1, the electric cable 25, which connects the midpoint 34 of the protection device 30 to the fuselage 6 and therefore to the electrical ground 11 of the aircraft 1, the first resistive element 32 of the protection device 30 and the phase 23, between the connection point 42 and the controlled and isolated electric power source 80.

The same logic for varying the resistivity value of the variable resistive system 31 of the protection device 30 as that described for FIG. 8 is implemented in order to increase the fault current (through the controlled decrease in the resistivity value of first resistive element 32) until tripping of the cut-off device 40a closest to the fault is enabled.

Once the cut-off device 40a has been tripped, the electrical network downstream from the fault is protected and the safety of goods and persons is thus ensured. The fault itself is not entirely isolated because it is still present in the controlled and isolated electric power source 80. The tripping of the cut-off device 40a allows such a fault to be identified as being present upstream from the protection device 30, and in order to isolate this fault, it is necessary to isolate the power source itself by acting upon a protection system (not shown) dedicated to said power source.

FIG. 10 illustrates the case of a fault within the controlled and isolated electric power source 80.

More specifically, this fault is shown here by the arrow 59 on the phase 22 between the secondary 92 of the generator 7 (whose primary 91 is shown here, and which is isolated from the secondary 92 through a galvanic insulation 93) and the rectifier 8.

It should further be noted that in FIG. 10 inductive components 94, 95 and 96 are shown, which are representative of the impedances of phases 20, 21 and 22, respectively.

It should also be noted that FIG. 10 shows the two half-bridges 97 and 98 of the rectifier 8, and here, said half-bridges are formed by diodes.

In this case, the fault current loop 60 comprises the phase 22, between the secondary 92 and the fault illustrated by the arrow 59, the fuselage 6 of the aircraft 1, the electric cable 25 connecting the midpoint 34 to the fuselage 6 and therefore to the electrical ground 11, the second resistive element 33, the phase 24 between the connection point 43 and the rectifier 8, the diode half-bridge 98, and as a consequence, the diode half-bridge 97 of the rectifier 8, the phase 23 between this rectifier and the connection point 42 and the first resistive element 32.

It should be noted that the fault loop 60 also comprises the two other phases 20 and 21 between the secondary 92 of the generator 7 and the rectifier 8, as a consequence of a connection point (not shown) located between each of these phases at the level of the secondary 92.

Therefore, in this case, two parallel fault loops are present.

Because of the potential drop on the faulty phase or the flow of an alternating current through the midpoint 34 of the protection device 30 the fault can be detected by the control and operating unit 35.

This control and operation unit 35 thus controls a variation in resistivity of the variable resistive system 31 by creating an imbalance and by providing the possibility of increasing the amplitude of the fault current either in that portion of the loop which comprises the first resistive element 32, or in that portion of the loop which comprises the second resistive element 33, in the same manner as mentioned above for FIGS. 6 to 9 (that is, by setting the resistivity value of one of the two resistive elements 32 and 33 to a high value while gradually decreasing the resistivity value of the other of the two resistive elements 32 and 33).

Thus, the fault current is increased by a controlled decrease in the resistivity value of one of the two resistive elements 32 and 33 until tripping of the cut-off device 40e located closest to the fault is enabled.

Once the cut-off device 40e has been tripped, the electrical network downstream from the fault is protected and the safety of goods and persons is thus ensured. The fault itself is not entirely isolated because it is still present in the controlled and isolated electric power source 80. The tripping of the cut-off device 40e allows such a fault to be identified as being present upstream from the protection device 30, and in order to isolate this fault, it is necessary to isolate the power source itself by acting upon a protection system (not shown) dedicated to said power source.

Figure 11:
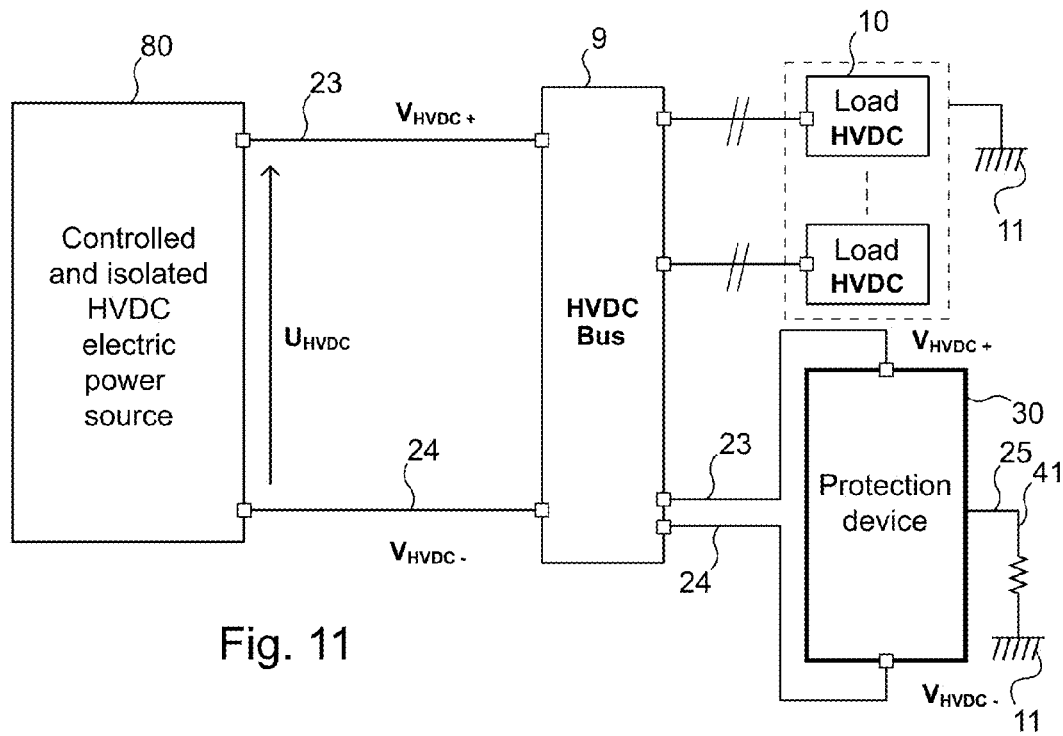
FIG. 11 is a view similar to that of FIG. 4, showing an alternative embodiment in which the protection device is arranged after the distribution bus.

FIG. 11 is a view similar to that of FIG. 4, showing a protection device 30 similar to that described with reference to FIGS. 4 and 5, except for its arrangement within the general electric network of the aircraft 1.

The protection device 30 shown in FIG. 11 is arranged after the HVDC distribution bus 9, or in other words, in parallel to the electrical loads 10, rather than being arranged between the controlled and isolated electric power source 80 and this HVDC distribution bus 9.

The HVDC distribution bus 9 therefore distributes the protection device 30 by connecting it to the two phases 23 and 24, as is the case for the electrical loads 10.

It is thus the full set of elements distributed by the HVDC bus 9, which is connected to the electrical ground 11 of the aircraft 1, namely the electrical loads 10 and the protection device 30, the protection device 30 being connected to the electrical ground 11 through the electric cable 25 (provided with a resistive element 41 representative of the impedance of this cable 25).

It should be noted that this protection method is employed in the same manner as described above and that the control and operating unit 35 is configured to control the variability of the resistivity of the protection device 30, also in the same manner as described above.

In a non-illustrated alternative embodiment, the control and operating unit 35 receives either the information representative of voltages VHVDC+ and VHVDC− or the information representative of current IM, or both, without knowing the origin of the information and therefore without knowing, for example, with which voltage a given numerical value is associated.

In this case, the control and operating unit 35 performs comparisons in order to detect whether a fault is present in the general electric network 12, without knowing from which phase this fault originates.

The faulty phase is therefore not identified at the time this so-called primary detection is performed.

The control and operating unit 35 is thus furthermore configured to effectively detect the faulty phase.

For that purpose, when a fault is detected by the control and operating unit 35, the latter is configured to control a resistivity variation of the first resistive element 32, in particular a gradual decrease, and wait, for a first predetermined period, until one of the power cut-off devices 40a and 40e has tripped.

If one of the power cut-off devices has tripped, then the fault has been isolated.

If, on the contrary, no cut-off device has tripped after the first predetermined period, then the control and operating unit 35 is configured to control the variation in resistivity of the second resistive element 33, in particular by gradually decreasing it, and to wait for a second predetermined period until one of the power cut-off devices has tripped.

In the case where a cut-off device has tripped, the fault has therefore been isolated.

It should be noted that before controlling the resistivity variation of the second resistive element 33, the first resistive element 32 is itself reset to a high resistivity value.

In non-illustrated alternative embodiments:

the power storage unit forming the electric power source is not a battery but rather a fuel cell;

the electrical rotating machine forming the electric power source is not a variable-frequency three-phase generator but rather another type of three-phase generator;

the electric power converter, whether it is of the rectifier or chopper type, is not a converter having two half-bridges formed of diodes but rather two half-bridges formed of transistors, or even thyristors;

the power cut-off devices are not devices of the differential protection type, but rather circuit-breakers which may or may not be remotely controlled, or which may even be of the electronic type, or fuses;

the general electric network comprises a larger or smaller number of power cut-off devices with, for example, each load not necessarily including an associated cut-off device, but with the general electric network simply including one or more power cut-off devices for a number of electrical loads;

the variable resistive system is not formed by two variable resistive elements whose midpoint is connected to the electrical ground of the aircraft, but instead by resistor arrays and controlled contactors, which arrays are provided with a midpoint connected to the electrical ground of the aircraft; and/or the electrical ground of the aircraft is not formed by the fuselage since the latter is made of a composite material, but instead by a mesh of electrical conductors, for example, of the ESN or CRN type (Electrical Structural Network and Current Return Network, respectively).

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. A method for protecting an electrical network for aircraft, wherein said network is a bipolar power distribution network, which is supplied with electrical power by an electric power source of said aircraft, said electric power source is isolated from an electrical ground of said aircraft, said bipolar power distribution network comprises two phases and a resistive protection device configured to be connected to said electrical ground of said aircraft and to the two phases of said bipolar power distribution network, wherein said method comprises the steps of:

receiving at least one voltage value on at least one of said two phases of said bipolar power distribution network and at least one current value in said electrical ground of said aircraft;

comparing at least one of
    said at least one voltage value with a first predetermined threshold value and
    said at least one current value with a second predetermined threshold value;

controlling said protection device by changing its resistivity according to said comparison.

2. The method according to claim 1, wherein said protection device is provided with a variable resistive system, wherein said method further comprises, prior to said receiving step, a step of controlling said variable resistive system so that said variable resistive system is balanced and has a first predetermined global resistance value.

3. The method according to claim 1, wherein said protection device is provided with a variable resistive system and said step of controlling said protection device according to said comparison is performed by controlling said variable resistive system so that it is imbalanced and has a second predetermined resistance value and a third predetermined resistance value smaller than said second predetermined resistance value.

4. The method according to claim 2, wherein said step of controlling said protection device according to said comparison is performed by controlling said variable resistive system so that it is imbalanced and has a second predetermined resistance value and a third predetermined resistance value smaller than said second predetermined resistance value and wherein said variable resistive system is formed by a bridge of variable resistive elements provided with a first resistive element connected to said one phase of said bipolar power distribution network, a second resistive element connected to said other phase of said bipolar power distribution network and separate from said first resistive element, and a midpoint located between said first and second resistive elements and connected to said electrical ground of said aircraft, with said first predetermined global resistance value being representative of a first predetermined resistance value of each of said first and second resistive elements.

5. The method according to claim 4, wherein said second predetermined resistance value is representative of the resistance value of one of said first and second resistive elements, which is connected to the faulty phase of said bipolar power distribution network, and said third predetermined resistance value is representative of the resistance value of the other of said first and second resistive elements, which is connected to the other non-faulty phase of said bipolar power distribution network.

6. The method according to claim 5, wherein said second predetermined resistance value is greater or equal to said first predetermined resistance value, and said third predetermined resistance value is gradually decreased.

7. The method according to claim 1, wherein said first predetermined threshold value is representative of a voltage of said electrical ground of said aircraft and the result of said step of comparing said first predetermined threshold value with said at least one voltage value is representative of the fact that said at least one voltage value is smaller or equal, in absolute value, to said first predetermined threshold value when a fault is present on said one phase of said bipolar power distribution network.

8. The method according to claim 1, wherein said second predetermined threshold value is representative of a current value in said electrical ground of said aircraft when no fault is present, that is, when it is approximately equal to zero, and the result of said step of comparing said second predetermined threshold value with said at least one current value is representative of the fact that said at least one current value is positive or negative and greater, in absolute value, than said second predetermined threshold value when a fault is present on said one phase of said bipolar power distribution network.

9. The method according to claim 1, wherein said bipolar power distribution network further comprises at least one power cut-off device and said method further comprises the step of tripping said power cut-off device.

10. A protection device in an electrical network for aircraft, wherein said network is a bipolar power distribution network comprising two phases, which is supplied with electrical power by an electric power source of said aircraft, said electric power source is isolated from an electrical ground of said aircraft, said protection device is resistive, is configured to be connected to said electrical ground of said aircraft and to the two phases of said bipolar power distribution network and comprises a control and operating unit configured for:
receiving at least one of at least one voltage value on at least one of said two phases of said bipolar power distribution network and at least one current value in said electrical ground of said aircraft;
comparing at least one of said at least one voltage value with a first predetermined threshold value and said at least one current value with a second predetermined threshold value;
controlling said protection device by changing a resistivity of said protection device according to said comparison.

11. The device according to claim 10, wherein the device comprises a variable resistive system and said control and operation unit is configured, before receiving at least one of at least one voltage value and at least one current value, to control said variable resistive system so that it is balanced and has a first predetermined global resistance value.

12. The device according to claim 10, wherein the device comprises a variable resistive system and said control and operation unit is configured to control said variable resistive system so that it is imbalanced and has a second predetermined resistance value and a third predetermined resistance value smaller than said second predetermined resistance value.

13. The device according to claim 11, wherein said control and operation unit is configured to control said variable resistive system so that it is imbalanced and has a second predetermined resistance value and a third predetermined resistance value smaller than said second predetermined resistance value and wherein said variable resistive system is formed by a bridge of variable resistive elements provided with a first resistive element connected to said one phase of said bipolar power distribution network, a second resistive element connected to said other phase of said bipolar power distribution network and separate from said first resistive element, and a midpoint located between said first and second resistive elements and connected to said electrical ground of said aircraft, with said first predetermined global resistance value being representative of a first predetermined resistance value of each of said first and second resistive elements.

14. The device according to claim 13, wherein said second predetermined resistance value is representative of the resistance value of said first or second resistive element, which is connected to the faulty phase of said bipolar power distribution network, and said third predetermined resistance value is representative of the resistance value of said first or second resistive element, which is connected to the other non-faulty phase of said bipolar power distribution network.

15. The device according to claim 14, wherein said second predetermined resistance value is greater or equal to said first predetermined resistance value, and said third predetermined resistance value is gradually decreased.

16. The device according to claim 10, wherein the device further comprises measurement instruments configured to perform at least one of voltage value measurements on said two phases of said bipolar power distribution network and current value measurements in said electrical ground of said aircraft.

17. An aircraft comprising an electrical network, an electric power source configured to supply electric power to said electrical network and an electrical ground, wherein said electric power source is isolated from said electrical ground, and said network is a bipolar power distribution network, which further comprises at least one protection device according to claim 10.

18. The aircraft according to claim 17, wherein the aircraft further comprises a power supply network, which includes said electric power source, which power supply network is connected to said bipolar power distribution network via an electric power converter.

19. The aircraft according to claim 18, wherein said electric power source is formed by a three-phase electrical rotating machine configured to operate as a variable-frequency generator and generate an alternating current, and said electric power converter is formed by a three-phase rectifier configured to convert AC electric power into DC electric power.

20. The aircraft according to claim 18, wherein said electric power source is formed by a power storage unit configured to generate a direct current, and said electric power converter is formed by a chopper configured to convert a DC electric power having a first amplitude into another DC electric power having a second amplitude greater than said first amplitude.

* * * * *